United States Patent [19]

Sutherland

[11] 3,754,233

[45] Aug. 21, 1973

[54] DIGITAL-TO-ANALOG CONVERSION APPARATUS AND METHOD

[75] Inventor: James F. Sutherland, Pittsburgh, Pa.

[73] Assignee: Westinghouse Electric Corporation, Pittsburgh, Pa.

[22] Filed: Nov. 19, 1971

[21] Appl. No.: 200,367

[52] U.S. Cl. .......... 340/347 DA
[51] Int. Cl. .......... H03k 13/02
[58] Field of Search .......... 340/347 DA; 235/197, 235/154, 150.5, 53

[56] References Cited

UNITED STATES PATENTS

| | | | |
|---|---|---|---|
| 3,529,138 | 9/1970 | Andre | 235/150.5 |
| 3,648,275 | 3/1972 | Bower | 340/347 DA |
| 3,646,545 | 2/1972 | Naydan | 340/347 DA |
| 3,525,861 | 8/1970 | Alexander | 235/197 |

*Primary Examiner*—Maynard R. Wilbur
*Assistant Examiner*—Jeremiah Glassman
*Attorney*—F. H. Henson, R. G. Brodahl et al.

[57] ABSTRACT

An indirect digital-to-analog conversion apparatus and method which combines the advantages of pulse rate modulation with pulse width or pulse duration modulation. Pulse duration modulation is used on the least significant bits; while pulse rate modulation is used on the more significant bits up to the most significant bit. In this manner, the advantages of both systems are combined resulting in a system in which conversion time is minimized while the ripple content in the analog output is also minimized.

10 Claims, 4 Drawing Figures

DIGITAL-TO-ANALOG CONVERSION APPARATUS AND METHOD

BACKGROUND OF THE INVENTION

Figures 1, 2:
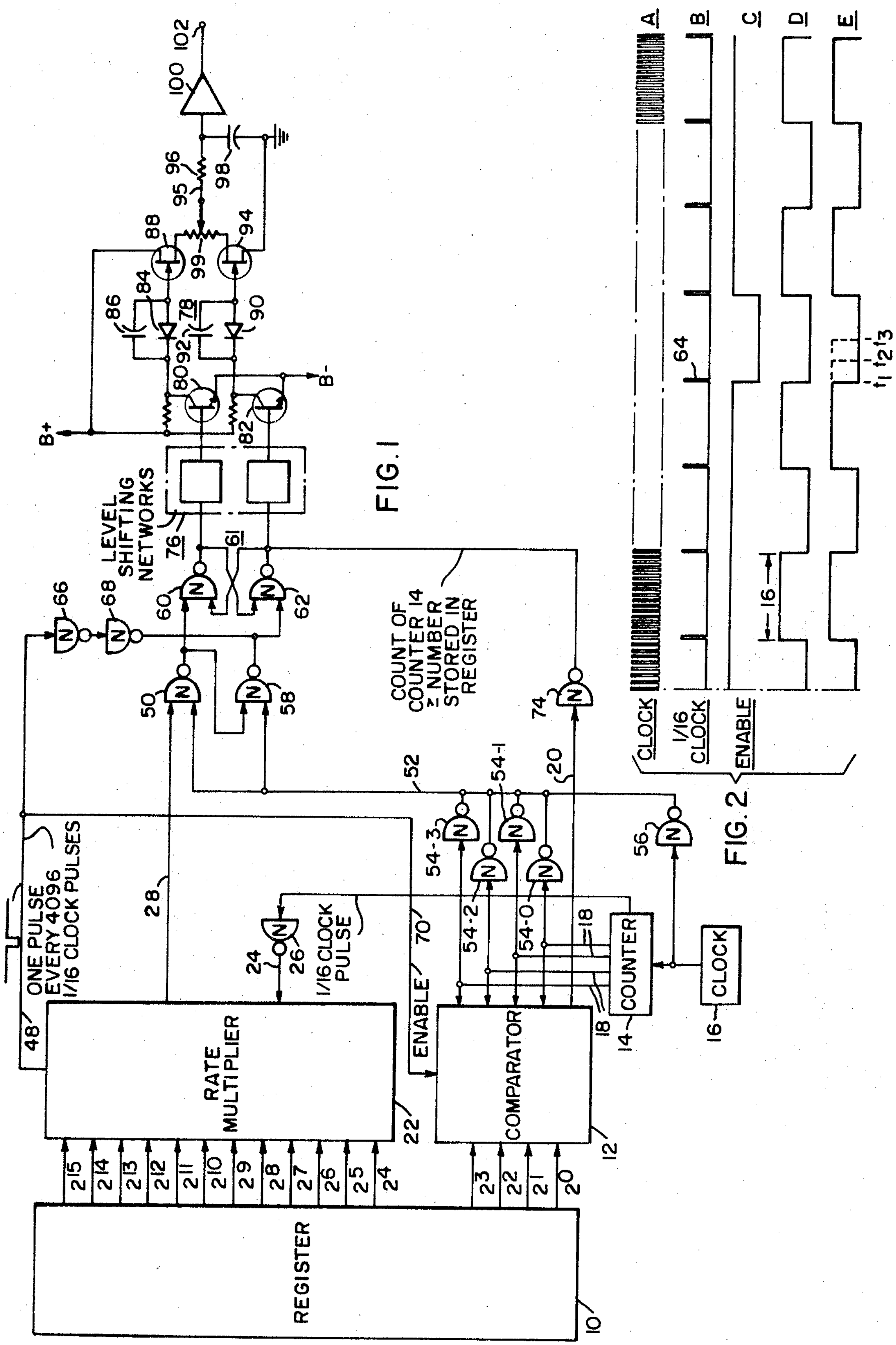

As is known, direct digital-to-analog converters utilize a resistive summing network, usually a ladder, driven by switching transitors. These transistors, in turn, are driven by the flip-flops or other storage units of a digital register. The register stores the digital information; and the corresponding analog level can be maintained for any desired duration. The most important advantages of this system are fast response and a ripple-free analog output. However, the accuracy of the system is dependent upon the tolerances of the resistors used in the ladder network; and this seriously limits the usefulness of the scheme.

High accuracy digital-to-analog conversion can be achieved by utilizing pulse duration modulation techniques or pulse rate modulation techniques. (See U.S. Pat. No. 3,603,977, and ELECTRONIC DESIGN 22, Oct. 24, 1968, pps. 70–77). With these approaches, normally referred to as indirect digital-to-analog conversion, the digital input is initially converted into a pluse or pulses which are thereafter converted into an analog signal. The accuracy of the conversion is determined by the precision of time measurements, rather than by component tolerance values.

In the usual type of pulse duration modulation system, the output of a digital register is compared with the count of a repeating counter. When the count of the counter matches that of the register, a flip-flop unit is caused to change states, thereby producing an output pulse whose width varies in direct proportion to the magnitude of the digital quantity which is to be converted to analog form. The counter is of the free-running type and will produce one output pulse with leading and trailing edges each time the counter counts up to its maximum value and resets to zero, where it again starts the counting process. In order to convert the pulsed output of the counter into analog form, the pulses from the flip-flop must be passed through a low-pass filter which produces the necessary smoothing of the output signal. As will be understood, extremely long times between the leading and trailing edges of the pulses in such an output signal imposes severe restrictions on the output filter and usually results in the generation of high ripple contents in the final analog signal because of the inherent time constant of the filter.

In the usual type of pulse rate modulation system, the output of a digital register is applied to a rate multiplier which will produce a series of output pulses whose cumulative widths are proportional to the value of the number stored in the digital register. These pulses are combined into a single pulse train, used to trigger a precision switch which produces pulses of fixed amplitude, and then filtered or integrated to produce a d.c. analog signal. The arrangement is such that a plurality of output pulses will be produced for any digital number stored in the register, the combined widths of these pulses being directly proportional to the magnitude of the number represented by the digital output. By virtue of the fact that for most digital values a plurality of pulses are produced rather than a single pulse, the filtering requirements at the output of the converter are materially reduced as is the ripple content of the final analog signal. However, a pulse rate modulation system of this type has certain disadvantages in that for long word lengths on the order of twelve bits or greater, the conversion period becomes excessively long unless the clock and precision switch can be speeded up. This latter requirement gives rise to errors due to nonsymmetrical switching of the precision switch at mid range if a fast clock is used. It is possible to use multiple pulse rate converters and sum their outputs; however this scheme loses the basic feature of monotonicity inherent in the single converter.

SUMMARY OF THE INVENTION

In accordance with the present invention, a digital-to-analog converter is provided which combines the advantages of both pulse rate modulation and pulse duration modulation while minimizing or eliminating the disadvantages of both.

Specifically, there is provided the combination of pulse rate modulation digital-to-analog conversion means for converting those bits extending from the most significant bit to an intermediate bit into a first train of pulses in which the cumulative widths of the pulses represents the numerical equivalent of the converter bits, and pulse duration modulation digital-to-analog conversion means for converting the remaining (i.e., the less significant) bits including the least significant bit into a unitary pulse whose width represents the numerical equivalent of the less significant bits subjected to pulse duration modulation. The unitary pulse produced by pulse duration modulation is injected into the train of pulses produced by the pulse rate modulation apparatus. The resulting train of pulses, incorporating the unitary pulse of variable width produced by pulse duration modulation, is then applied through a constant amplitude fixing device to apparatus (for example a low pass filter) for extracting the average D.C. component thus to produce an analog signal having a value proportional to the combined widths of the pulses of equal width produced by pulse rate modulation plus the width of the pulse of variable duration produced by pulse duration modulation. The purpose of the constant amplitude fixing device is to convert the pulses of the train into pulses having precisely defined and constant levels while preserving the time relations of the original pulses. Such a converting device may for example be what is known in the D/A converter art as a "precision switch," also known as an "analog switch."

In this manner, the sampling period of the digital-to-analog converter can be materially reduced over the case where all bits are subjected to pulse rate modulation since the value for the least significant bits can be injected into the system with a single pulse. At the same time, the undesirable ripple frequency which occurs with straight pulse duration modulation techniques is eliminated. For example, if it is desired to convert to analog form 16 bits, the first four bits (i.e., $2^0$ to $2^3$) are subjected to pulse duration techniques while the remaining 12 bits (i.e., $2^4$ to $2^{15}$) are subjected to pulse rate modulation techniques wherein the maximum width of the pulse produced by the pulse duration modulator is less than the uniform width of the individual pulses produced by pulse rate modulation. In this manner, the number of clock pulses applied to the pulse rate modulation system during each read-out cycle can be reduced from 65,536 to 4,096 since the pulse rate modulation portion is now dealing with only 12 bits rather than 16. Thus, the sampling period can be reduced by a factor of 16.

Figure 3:
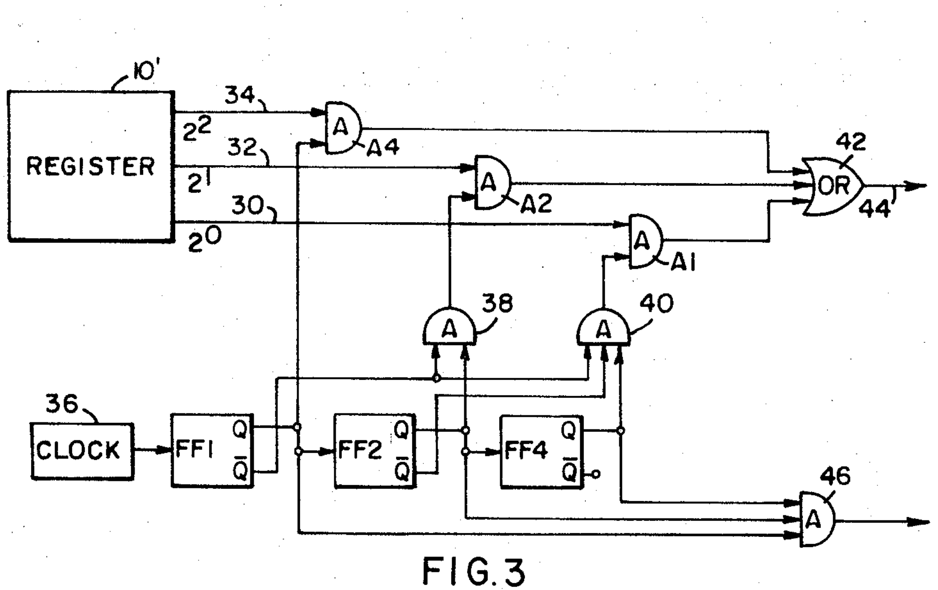
Figure 4:
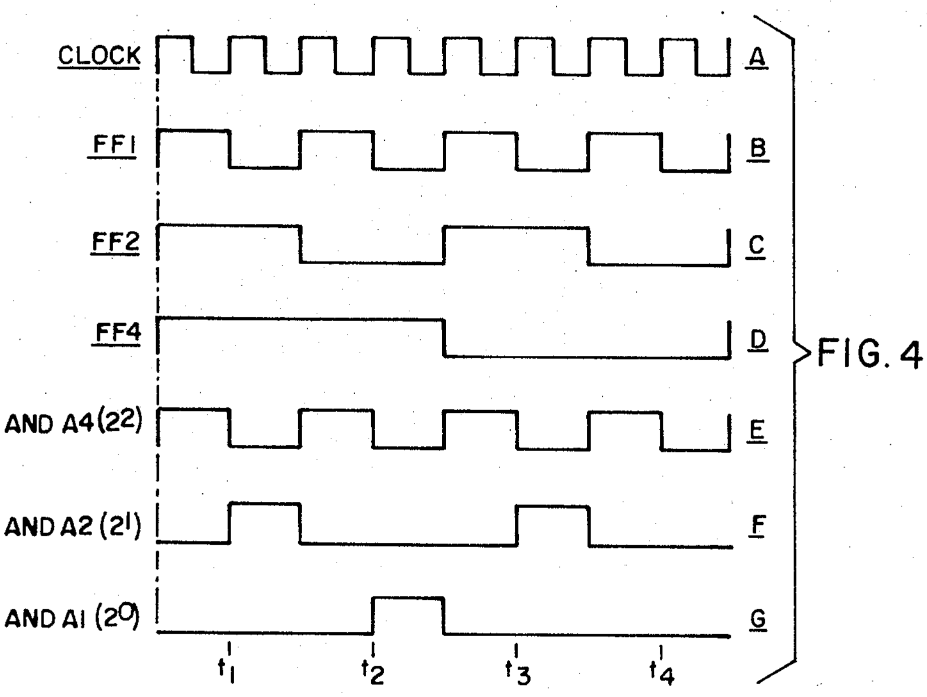

The above and other objects and features of the invention will become apparent from the following detailed description taken in connection with the accompanying drawings which form a part of this specification, and in which:

FIG. 1 is a block diagram of one embodiment of the invention;

FIG. 2 comprises waveforms illustrating the operation of the system of FIG. 1;

FIG. 3 is a schematic circuit diagram, on a simplified basis, of a rate multiplier of the type utilized in the embodiment of the invention shown in FIG. 1; and FIG. 4 comprises waveforms illustrating the operation of the simplified rate multiplier shown in FIG. 3.

With reference now to the drawings, and particularly to FIG. 1, a register 10 is shown having a plurality of output leads on which ON and OFF signals appear representing bits in a binary number. In the particular embodiment of the invention shown herein, 16 bits representing $2^0$ to $2^{15}$ are employed. The bits $2^0$ through $2^3$ are applied to a comparator 12 where they are compared with the output of a counter 14 driven by clock 16. The counter 14 is of the binary type and is provided with four output leads, the arrangement being such that the counter can produce binary signals on the leads 18 representing a maximum count of 15. These signals on leads 18 are compared in comparator 12 with the ON and OFF signals representing the bits $2^0$ to $2^3$; and when the count of the counter 14 matches the bits at the output of register 10, a signal can be produced on lead 20 indicating equality. In this respect, the comparator 12 and counter 14 form part of a pulse duration modulation digital-to-analog converter. That is, assuming that the leading edge of a pulse occurs when the count of counter 14 is zero and that the trailing edge occurs upon the occurrence of a signal on lead 20 indicating a match of the count of counter 14 with the signals at the output of register 10, the width of the resulting pulse will be proportional to the numerical equivalent of the ON bits at the output of register 10.

The bits $2^4$ to $2^{15}$ at the output of register 10 are applied to a rate multiplier 22 having clock pulses applied thereto through lead 24 from a NAND circuit 26. The NAND circuit 26, in turn, is connected to the output of counter 14 such that one clock pulse will be applied to the rate multiplier 22 for every 16 clock pulses applied to the counter 14. That is, one clock pulse appears on lead 24 each time the counter 14 counts up to 16 and is reset to begin a new counting cycle.

The rate multiplier 22 comprises a circuit which will produce on output lead 28 a series of pulses whose cumulative widths, when filtered, represent the numerical equivalent of the binary bits $2^4$ to $2^{15}$ at the output of register 10. The rate multiplier 22, for example, may comprise Type SN-7497 Synchronous Rate Multiplier manufactured by Texas Instruments, Inc. of Dallas, Tex. Actually, it comprises two such synchronous rate multipliers connected in cascade.

The operation of a rate multiplier of this type on a simplified basis is illustrated in FIGS. 3 and 4 where only three bits are employed; however it will be understood that the number of bits may be extended up to 16 or more using the same basic configuration. With reference to FIG. 3, the register 10′ has output leads on which binary signals appear. The least significant bit $2^0$ appears on lead 30; the next significant bit $2^1$ appears on lead 32; and the most significant bit $2^2$ in the example given appears on lead 34. The leads 30, 32 and 34 are each applied to one input of an associated AND circuit A1, A2 or A4, respectively, which function as sampling gates.

The rate multiplier includes a counter consisting of three flip-flops FF1, FF2 and FF4 connected in cascade. Each flip-flop FF1-FF4 is provided with Q and $\overline{Q}$ terminals. The Q terminal of flip-flops FF1 and FF2 is connected to the input of the next successive flip-flop as shown. The input to the first flip-flop FF1 is the output of a clock 36.

The Q terminal of flip-flop FF1 is connected to the sampling input of AND circuit A4. The $\overline{Q}$ terminal of flip-flop FF1 and the Q terminal of flip-flop FF2 are applied as inputs to AND circuit 38, the output of this AND circuit being applied as the sampling input to AND circuit A2. Similarly, the $\overline{Q}$ terminal of flip-flop FF2 and the Q terminal of flip-flop FF4 are connected as inputs to AND circuit 40 along with the $\overline{Q}$ terminal of flip-flop FF1. The output of the AND circuit 40, in turn is connected as a sampling input to AND circuit A1. The outputs of all of the sampling gates A1, A2 and A4 are connected to the input of an OR circuit 42, the output of the OR circuit appearing on lead 44.

The operation of the rate multiplier of FIG. 3 can best be understood by reference to FIG. 4 wherein the waveform A represents the clock pulses generated by the clock 36. In the example given in FIG. 4, there are eight such clock pulses represented by waveform A. These pulses, when applied to the flip-flop FF1, will produce at its terminal Q waveform B comprising a series of pulses of one-half the frequency of the input pulses from clock 36. The output of flip-flop FF2 appears as waveform C comprising pulses twice the width of those in waveform B but half the frequency. The output pulses appearing on terminal Q of flip-flop FF4 will appear as waveform D wherein each pulse is twice the width of that in waveform C but one-half the frequency.

Waveform E in FIG. 4 represents the waveform applied to the lower input (sampling input) of the AND circuit A4 and is the same as waveform B. Assuming that the signal on lead 34 of the register 10′ is ON or enabled, the output of AND circuit A4 will be four pulses for every eight input clock pulses in waveform A. AND circuit 38 will produce an ON output when the output of flip-flop FF1 is negative or OFF while the output of flip-flop FF2 is positive or ON. From an examination of waveforms B and C, it can be seen that this occurs at times $t_1$ and $t_3$. Consequently, waveform F represents the output of AND circuit 38. It can be seen, therefore, that when the signal at the output of register 10′ on lead 32 is ON or positive, two pulses will be produced at the output of AND circuit A2, as represented by waveform F, for each eight input clock pulses.

AND circuit 40 will produce an output when the outputs of flip-fiops FF1 and FF2 are OFF while the output of flip-flop FF4 is ON. Again, from an examination of waveforms B, C and D, it can be seen that this occurs at time $t_2$. Consequently, and assuming that the output of register 10′ on lead 30 is ON, meaning that the digital signal stored in the register includes the bit $2^0$, one pulse will be produced at the output of AND circuit A1 (waveform G) for each eight input pulses from the clock 36.

From a consideration of waveforms E, F and G of FIG. 4, it will be appreciated that whenever the digital number stored in register 10′ includes the bit $2^2$, four pulses will be applied to OR circuit 42 when the counter of flip-flops FF1 through FF2 counts up to its maximum value. When it includes the bit $2^1$, two pulses will be applied to the OR circuit 42; and when it includes the bit $2^0$, one pulse will be applied to OR circuit 42. The pulses applied to the OR circuit 42 from the respective AND circuits A1 through A4, each time the counter of flip-flops FF1 through FF4 counts up to its maximum count, will be proportional to the bit represented by that AND circuit. Consequently, by integrating the cumulative pulses at the output of OR circuit 42, an analog signal proportional to the numerical equivalent of the bits stored at the output leads on register 10′ can be derived; and this is the essence of digital-to-analog conversion using pulse rate modulation techniques.

Also included in the register of FIG. 3 is an AND circuit 46 having its inputs connected to the Q terminals of all flip-flops FF1 and FF2 and FF4. From consideration of the waveforms of FIG. 4, it can be seen that these outputs are all OFF only at time $t_4$, which occurs at the leading edge of the eighth clock pulse. An output will persist at AND circuit 46 for the period of one pulse in waveform B which represents, after filtering, the equivalent of the number 1.

With reference again to FIG. 1, the rate multiplier 22 operates on the same basic principle as the simplified rate multiplier shown in FIG. 3 except that it has 12 input bits rather than only three. The clock pulses on lead 24 correspond to those from clock 36 in FIG. 3; the output on lead 28 corresponds to the output on lead 44; and the output on lead 48 corresponds to the output of AND circuit 46 of FIG. 3. In this case, however, the range of values obtained from the rate multiplier 22 alone, is 0 to $(2^{12}-1)$ times 16. Consequently, a pulse will be produced on lead 48 when the 4,096th 1/16 clock pulse is applied to lead 24. In this case, the time between each clock pulse transition applied to lead 24 represents the numerical equivalent of 16 rather than one since the least significant bit, as applied to rate multiplier 22, is $2^4$.

The output of the rate multiplier 22 comprising pulses on lead 28 is applied to one input of a NAND circuit 50; while the other input to the NAND circuit 50 is derived from lead 52 at the output of NAND circuits 54-0, 54-1, 54-2 and 54-3. An additional input to lead 52 is from NAND circuit 56 connected to the output of clock 16. Assuming that the signal on lead 28 is in a 1 condition and that a 1 signal must also be applied to lead 52 in order to change the output at NAND circuit 50, 0 inputs must be applied to all of the NAND circuits 56 and 54-0 through 54-3. This occurs only when the counter counts up to its maximum count of 16 preparatory to a succeeding counting cycle and when a pulse is produced at the output of clock 16. In other words, a 1 will appear on lead 52 at the beginning of a counting cycle of counter 14. This will coincide with the leading edge of a 1/16 clock pulse applied to rate multiplier 22 as well as to the leading edge of a pluse on lead 28.

Assuming that 1 signals are applied to both inputs of NAND circuit 50, a 0 signal will appear at its output, thereby insuring that a 1 signal appears at the output of NAND circuit 58 which has the output of NAND circuit 50 and the signal on lead 52 applied to its inputs. Thus, when the leading edge of a pulse occurs on lead 28, and assuming that counter 14 is beginning its counting cycle, the 0 and 1 outputs from NAND circuits 50 and 58 will cause the flip-flop 61 consisting of interconnected NAND circuits 60 and 62 to assume one stable state where the output of NAND circuit 60 is a 1 and the output of NAND circuit 62 is a 0. When no pulse is present on lead 28 during the time that lead 52 is a 1, the signals occurring at the outputs of elements 50 and 58 will reverse, thereby causing the flip-flop 61 to reverse stable states whereby the output of NAND circuit 60 is 0 and the output of NAND circuit 62 is 1.

The operation of the circuit of FIG. 1 can be understood by reference to FIG. 2 wherein waveform A represents the clock pulses at the output of clock 16. Waveform B represents the 1/16 clock pulses which are applied to the rate multiplier 22. Representative output pulses from the rate multiplier on lead 28 are illustrated by waveform D. As mentioned, the width of each pulse in waveform D represents a numerical value of 16 since the least significant bit applied to the rate multiplier is $2^4$. Pulse widths representing numbers larger than 16 can be immediately adjacent to each other in waveform D of FIG. 2 appearing as one long pulse. Separated pulse lengths are shown in FIG. 2 for simplicity. At the leading edges of pulses on lead 52, flip-flop 61 is forced to a state corresponding to the signal level on lead 28 until the application of the 4,096th 1/16 clock pulses to the rate multiplier 22. In FIG. 2, it will be assumed that pulse 64 is the 4,096th pulse applied to the rate multiplier 22. This would correspond to the clock pulse in FIG. 4 whose leading edge occurs at time $t_4$. Under these circumstances, the signal on lead 48 will change from a 1 to a 0, thereby applying a 0 input to NAND circuit 62 through NAND circuits 66 and 68. A 0 signal input to NAND circuit 62 disrupts the bistable action of NAND circuits 60 and 62. During the time that pulse 68 is a 0 signal, the output of NAND circuit 60 is totally controlled by the comparator output signal 20. At the same time, the pulse on lead 48 represented as waveform C in FIG. 2, is applied through lead 70 to the comparator 12. At the leading edge of the pulse in waveform C, the counter 14 has begun a counting cycle; and as it counts up, a point will be reached where the count of counter 14 on leads 18 will match that on the $2^0$ to $2^3$ bits from register 10 in comparator 12. At this time, a 0 signal will be produced on lead 20 which is converted by NAND circuit 74 to a 1 that is applied to the input side of NAND circuit 60, thereby causing the output of NAND circuit 60 to go to 0. This can perhaps best be explained by reference to FIG. 2. Let us assume, for example, that the leading edge of the enable pulse in waveform C occurs at time $t_1$ and that the signal on the $2^2$ lead from register 10 is a 1 while all other signals at the input to comparator 12 are 0, indicating a numerical count of four. When the counter 14 counts four input pulses from clock 16, the comparator 12 will produce a signal on lead 20 at time $t2$, thereby causing the output signal of element 60 to switch and cause the trailing edge of a pulse in waveform E. Again, if a count of eight is applied to the comparator 12 from register 10, then the NAND circuit 60 will not switch states until time $t_3$.

Assuming, again, that the width of a normal pulse in waveform E represents the numerical equivalent of 16, then the period between times $t_1$ and $t_3$ represents the numerical equivalent of eight and the period between times $t_1$ and $t_2$ represents the numerical equivalent of four. Assuming the height of the pulses in waveform D is constant, what has been done during each sampling period of the rate multiplier 22 is to add to waveform D a pulse width proportional to the numerical equivalent of the bits applied to the comparator 12.

It will be understood, of course, that the pulses from the flip-flop 61 may vary in height. Accordingly, these pulses are applied to a precision switching system, generally indicated by the reference numeral 78. Level shifting networks 76 are optionally interposed if required to make the output levels of NAND circuits 60 and 62 compatible with the input level requirements for the switching states of the analog switching system 78. The precision switching system 78 includes a pair of input transistors 80 and 82 to which the outputs of NAND circuits 60 and 62, respectively, are applied. The collector of transistor 80 is connected through the diode 84 in shunt with a capacitor 86 to the gate electrode of a field effect transistor 88. Similarly, the collector of transistor 82 is connected through diode 90 in shunt with capacitor 92 to the gate electrode of a second field effect transistor 94. The two field effect transistors 88 and 94 are connected in series between a source of potential and ground; and an output is derived from a potentiometer 99 connected between the electrode of transistor 88 and the drain electrode of transistor 94. The field effect transistors 88 and 94 form the actual precision or analog switch, while the preceding elements of the switching system 78 such as the transitors 80 and 82 act as drivers for the switching transistors 88 and 94. As was hereinbefore mentioned, the precision switch performs the function of a constant amplitude device and translates or converts the incoming train of pulses into pulses having precisely defined and constant levels and the same time relations as the original pulses. Thus the amplitude and reference levels of the resulting pulses appearing at the output line 95 of the precision switch are precise and constant while the time relations of the original pulses are preserved.

The constant amplitude pulses appearing on the output line 95 of the analog switch, are applied to apparatus for extracting the average or D.C. component from the pulses for example a low pass filter consisting of resistor 96 and capacitor 98. The output of the filter, in turn, is applied through an operational amplifier 100 to an output terminal 102 on which a direct current signal appears having a magnitude proportional to the numerical equivalent of the binary bits at the output of register 10. The potentiometer 99 provides linearity adjustment of the system.

The combining of pulse rate modulation (PRM) with pulse duration modulation (PDM) in accordance with the invention herein takes advantage of the fact that with pulse rate modulation there exists a "zero pulse" time during which no pulse is ever gated into the filter. When the sampling gate inputs are all logical zero, there can be no pulses on the pulse train line. For a 12-bit PRM converter, this occurs once per 4,096 pulses. By segregating the lower four bits of a 16-bit number and using them to vary the width of an extra pulse injected into the pulse train during "zero pulse" time, conversion of a 16-bit number is accomplished in the same time as required for a 12-bit number in the PRM system alone. The resolution, linearity, and accuracy of the PRM/PDM system of the invention is excellent. The conversion period for a 16-bit number is the same for the PRM/PDM system of the invention as for a 12-bit PRM system. The carrier frequency of the PRM/PDM system disclosed herein is no lower than the carrier frequency of a PRM system, and therefore excellent filtering is performed. No transient noise spikes occur in the output when the number being converted is changed in mid-cycle to a new number. Excellent linearity results from the number of "cardinal" points in the output response (in the example — 4,096 cardinal points). These points result when the low order four bits of the 16-bit number are zero (0000), calling for no "zero pulse" in the pulse train. The output of the converter disclosed herein is always monotonic and errors due to nonlinearity are extremely small.

While the example disclosed herein is in connection with the D/A conversion of pure binary numbers, the invention is equally applicable to conversion of binary coded number systems, for example binary coded decimal numbers.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. In apparatus for converting electrical signals representing binary digits of a number to an analog electrical signal having a magnitude proportional to the numerical equivalent of said number, the combination of pulse rate modulation digital-to-analog conversion means for converting those bits extending from the most significant bit to an intermediate bit into a first train of pulses whose cumulative widths represent the numerical equivalent of the converted bits, pulse duration modulation digital-to-analog conversion means for converting the remaining bits including the least significant bit into a unitary pulse whose width is representative of the numerical equivalent of said remaining bits, means for injecting said unitary pulse into said train of pulses, and means for extracting the average component from said train of pulses including said injected pulse to derive an analog signal proportional in magnitude to the numerical equivalent of said number.

2. The combination as in claim 1 wherein said number is a pure binary number.

3. The apparatus of claim 1 wherein said pulse train digital-to-analog conversion means includes a pulse rate multiplier driven by clock pulses and having a sampling period corresponding to the time required to feed to the rate multiplier a number of pulses corresponding to the numerical equivalent of the most significant bit fed into the rate multiplier, and wherein said pulse duration digital-to-analog conversion means includes a comparator for comparing ON and OFF digital signals representing bits with the output of a counter, the clock pulses applied to said rate multiplier being generated once during each cycle of said counter.

4. The apparatus of claim 1 wherein the width of the pulse injected by said pulse duration modulation means is no greater than the width of the pulse produced by the least significant bit fed to said pulse rate modulation means.

5. The apparatus of claim 1 wherein said means for injecting said unitary pulse into said train of pulses includes a circuit which changes from a first state to a second state in response to the absence of pulses at the output of said pulse rate modulation means and changes from its second to its first state in response to the presence of pulses at the output of said pulse rate modulation means, and including means for causing said circuit to assume its first state at the termination of a sampling period of said pulse rate modulation means and thereafter change to its second state following a time delay which varies as a function of the numerical equivalent of bits applied to said pulse duration modulation means.

6. The apparatus of claim 5 wherein said last-named means includes a clock pulse generator, a counter driven by said clock pulse generator, and a comparator for comparing the count of said counter with the bits subjected to pulse duration modulation.

7. The apparatus of claim 6 wherein said comparator acts to cause said circuit to change to its second state when the count of said counter matches or exceeds the numerical equivalent of bits subjected to pulse duration modulation.

8. The apparatus of claim 1 including a precision switch to which said train of pulses is applied before being averaged.

9. The method of converting electrical signals representing binary digits of a number to an analog electrical signal having a magnitude proportional to the numerical equivalent of said binary number comprising the steps of converting those bits extending from the most significant bit to an intermediate bit into a first train of pulses whose cumulative widths represent the numerical equivalent of the converted bits, converting the remaining bits including the least significant bit into a unitary pulse whose width is representative of the numerical equivalent of said remaining bits, injecting said unitary pulse into said train of pulses, and extracting the average component from said train of pulses including said injected pulse to derive an analog signal proportional in magnitude to the numerical equivalent of said number.

10. The combination as in claim 9 wherein said number is a pure binary number.

* * * * *